(12) United States Patent
Mugunda et al.

(10) Patent No.: US 11,497,132 B1
(45) Date of Patent: Nov. 8, 2022

(54) BACKPLANE CONFIGURATION AND MANAGEMENT SYSTEM

(71) Applicant: Dell Products L.P., Round Rock, TX (US)

(72) Inventors: Chandrasekhar Mugunda, Austin, TX (US); Shivabasava Karibasappa Komaranalli, Round Rock, TX (US); Rui An, Austin, TX (US); Akshata Sheshagiri Naik, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/356,952

(22) Filed: Jun. 24, 2021

(51) Int. Cl.
  *G06F 1/16* (2006.01)
  *H05K 5/00* (2006.01)
  *H05K 7/00* (2006.01)
  *H05K 7/14* (2006.01)

(52) U.S. Cl.
  CPC ......... *H05K 7/1438* (2013.01); *H05K 7/1488* (2013.01); *H05K 7/1498* (2013.01)

(58) Field of Classification Search
  CPC .. H05K 7/1438; H05K 7/1488; H05K 7/1498; H05K 7/1439; H05K 7/1441; H05K 7/1448; H05K 7/1449; H05K 7/1492
  See application file for complete search history.

(56) References Cited

U.S. PATENT DOCUMENTS

| | | | | |
|---|---|---|---|---|
| 9,335,799 B2* | 5/2016 | Nguyen | ................ | G06F 1/1601 |
| 10,156,987 B1* | 12/2018 | Gutierrez | ................ | G06F 1/206 |
| 10,324,878 B1* | 6/2019 | Lambert | ................ | H04L 49/30 |
| 2008/0281992 A1* | 11/2008 | Hsu | ................ | G06F 13/37 710/4 |
| 2009/0144568 A1* | 6/2009 | Fung | ................ | G06F 1/324 713/300 |
| 2012/0159029 A1* | 6/2012 | Krishnan | ................ | G06F 3/0626 710/301 |
| 2015/0067226 A1* | 3/2015 | Iskandar | ................ | G06F 13/4031 710/309 |
| 2015/0142939 A1* | 5/2015 | Petrick | ................ | H04L 41/0853 709/223 |

(Continued)

*Primary Examiner* — Anthony M Haughton
(74) *Attorney, Agent, or Firm* — Joseph Mencher

(57) ABSTRACT

A backplane management and configuration system includes a chassis housing a first storage system having a first backplane, a second storage system having a second backplane, a second computing device coupled to each of the first backplane and the second backplane via a second multiplexer and a communication bus, and a first computing device coupled to each of the first backplane and the second backplane via a first multiplexer and the communication bus. A backplane configuration/management subsystem in the first computing device detects a multi-computing-device configuration including the first and second computing devices in the chassis and, in response, determines a first computing device location in the chassis. Based on the first computing device location, the backplane configuration/management subsystem identifies a first backplane identifier for the first backplane and, in response, configures the first backplane for management by the backplane configuration/management subsystem and ignores the second backplane.

20 Claims, 6 Drawing Sheets

(56) References Cited

U.S. PATENT DOCUMENTS

2016/0073542 A1* 3/2016 Huang ................. H05K 7/1492
                                                    361/781
2017/0220506 A1* 8/2017 Brown ................. G11B 33/128
2021/0057001 A1* 2/2021 Nelogal .................... G06F 3/06

* cited by examiner

| MODE | COMPUTING DEVICE | BACKPLANE 212a | BACKPLANE 214a | BACKPLANE 218a | BACKPLANE 220a |
|---|---|---|---|---|---|
| DUAL COMPUTING DEVICE | COMPUTING DEVICE 204 | BAY 0 | BAY 1 | -- | -- |
|  | COMPUTING DEVICE 206 | -- | -- | BAY 0 | BAY 2 |
| SINGLE COMPUTING DEVICE | COMPUTING DEVICE 204 | BAY 0 | BAY 1 | -- | BAY 2 |

FIG. 5

BACKPLANE CONFIGURATION AND MANAGEMENT SYSTEM

BACKGROUND

The present disclosure relates generally to information handling systems, and more particularly to configuring and managing backplanes in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server systems like the DELL EMC® POWEREDGE® XE7100 available from DELL® EMC® of Hopkinton, Mass., United States and Round Rock, Tex., United States, may be provided with one or more modular server devices (sometimes called "server sleds") in a variety of server configurations, including a single server device/node in an active or passive mode (e.g., a "single node active" configuration or "single node passive" configuration), a pair of server devices (a "dual node" configuration), more than two server devices, and/or other configurations known in the art. In such server systems, each storage system available to the server device(s) in any of the different server configurations may include multiple storage backplanes that may be connected via a single/common Inter-Integrated Circuit (I2C) bus to multiplexers in a mid-plane in the server system that may each connect a respective server device to the storage systems, which can raise some issues due to difficulties associated with configuring and managing multiple backplanes connected to a single/common I2C bus.

For example, when the server system is configured in the "dual node" configuration (i.e., a pair of server devices) or with more than two server devices as discussed above, each server device may be connected via a respective multiplexer in the mid-plane in the server system to one or more storage backplanes in each of the multiple storage systems, and those storage backplanes connected to the multiplexers are not fixed with respect to the ports on those multiplexers through which they connect to their respective server device. As such, the storage backplanes and their Field Replaceable Units (FRUs) reported by the multiple server devices may be interchanged across those server devices, presenting issues with regard to the configuration and management of those storage backplanes by those server devices. For example, configuration and management scripts may be provided for the "single node active" or "single node passive" configurations (configurations which are not subject to the storage backplane/FRU interchanging discussed above due to the presence of only a single server device), and those configuration and management scripts will fail in the "dual node" configuration discussed above because the storage backplanes cannot be distinguished.

Accordingly, it would be desirable to provide a backplane configuration and management system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a backplane configuration/management engine that is configured to: detect a multi-computing-device configuration that includes the first computing device and a second computing device in a chassis; determine, in response to detecting the multi-computing-device configuration, a first computing device location of the first computing device in the chassis; identify, based on the first computing device location, a first backplane identifier for a first backplane in a first storage system that is coupled to each of the first computing device and the second computing device via a communication bus and, in response: configure the first backplane in first storage system for management by the first backplane configuration/management engine; and ignore a second backplane in a second storage system that is coupled to each of the first computing device and the second computing device via the communication bus.

BRIEF DESCRIPTION OF THE DRAWINGS

FIG. 5 is a table view illustrating an embodiment of backplane configuration and management designations that may be made using the backplane configuration and management system of the present disclosure.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
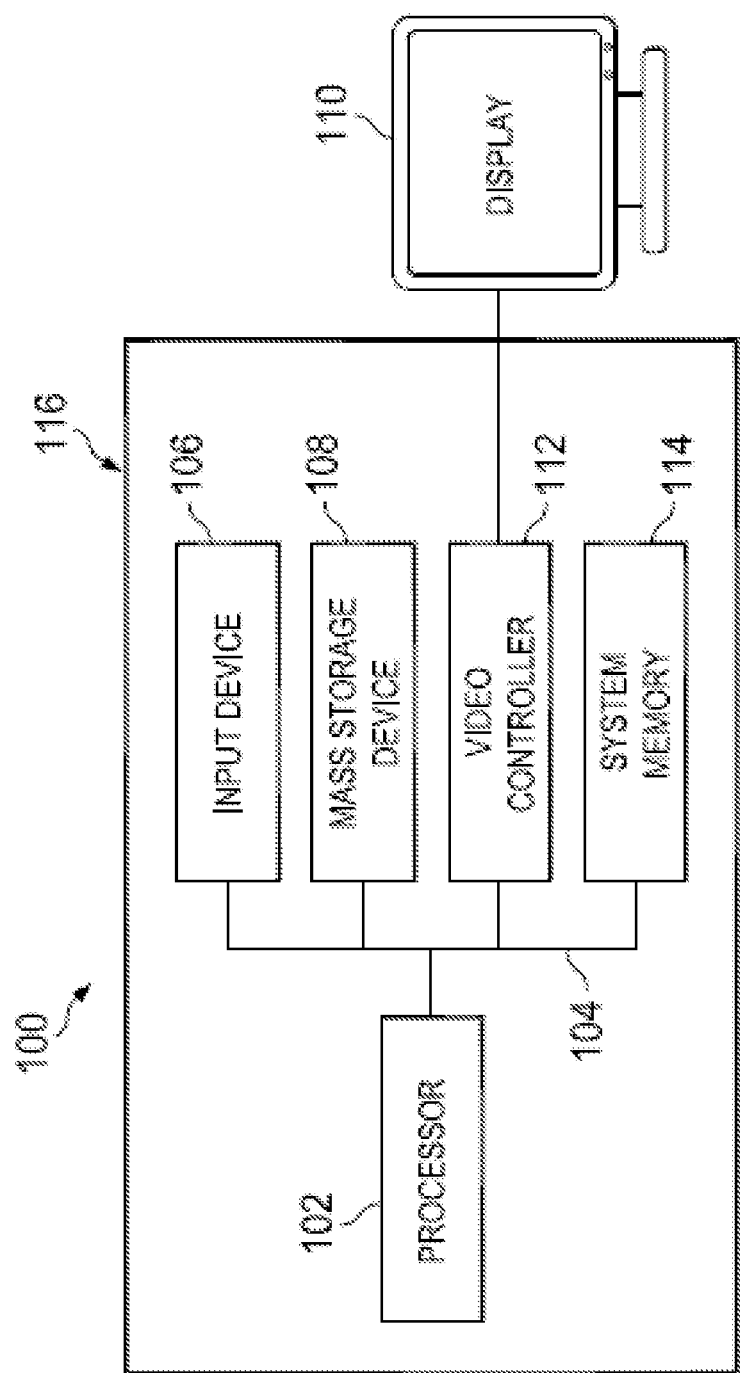
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
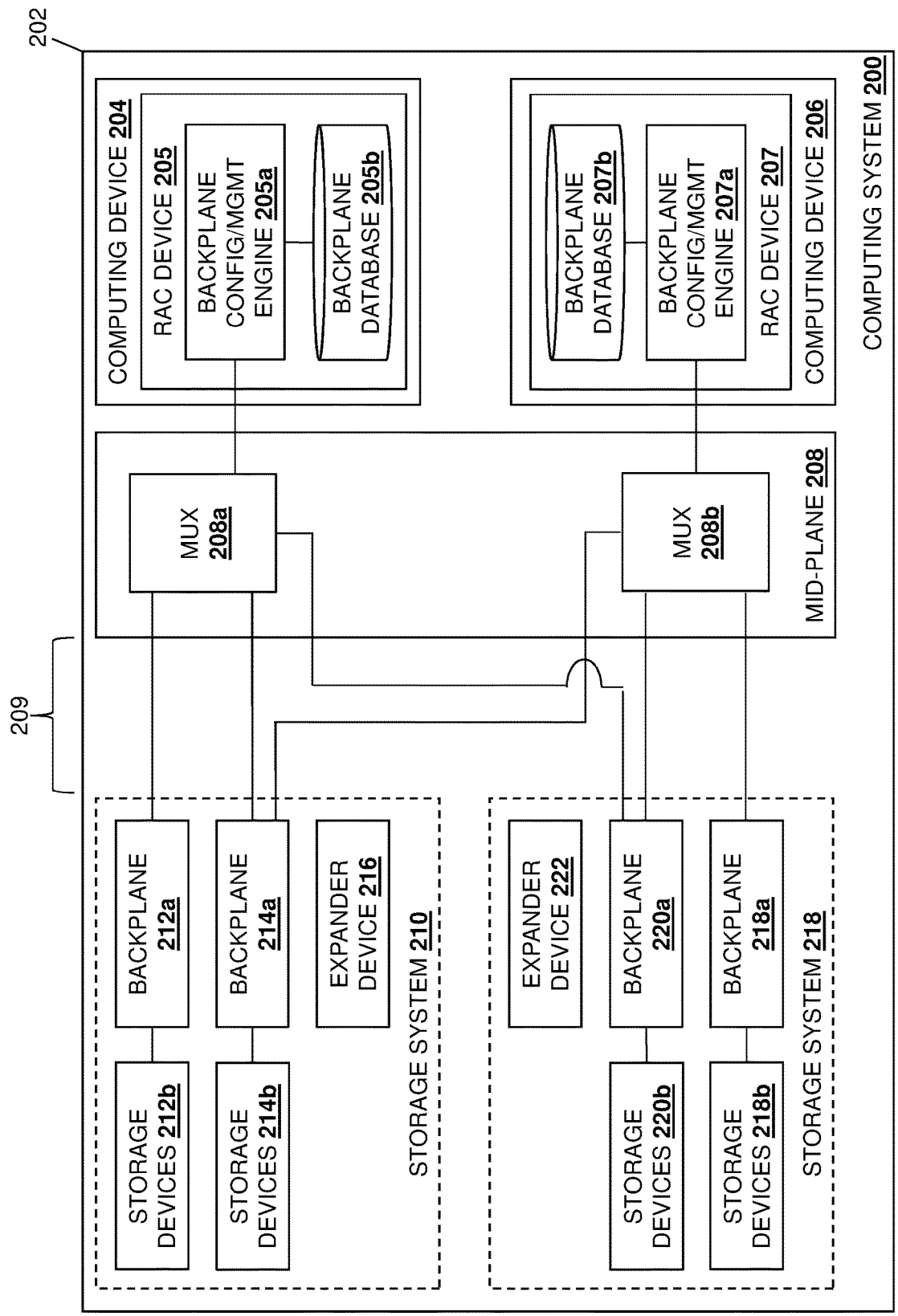
FIG. 2 is a schematic view illustrating an embodiment of a computing system that may include the backplane configuration and management system of the present disclosure.

Referring now to FIG. 2, an embodiment of a computing system 200 is illustrated that may include the backplane configuration and management system of the present disclosure. In an embodiment, the computing system 200 may be provided by the IHS 100 discussed above with reference to FIG. 1 and/or may include some or all of the components of the IHS 100, and in a specific example may be provided by server systems such as the DELL EMC® POWEREDGE® XE7100 available from DELL® EMC® of Hopkinton, Mass., United States and Round Rock, Tex., United States. However, while illustrated and discussed as a being provided by a particular server system, one of skill in the art in possession of the present disclosure will recognize that the functionality of the computing system 200 discussed below may be provided by other devices that are configured to operate similarly as the computing system 200 discussed below. In the illustrated embodiment, the computing system 200 includes a chassis 202 that houses the components of the computing system 200, only some of which are illustrated below.

For example, in the illustrated embodiment, the chassis 202 houses a computing device 204 that includes a Remote Access Controller (RAC) device 205, and a computing device 206 that includes a Remote Access Controller (RAC) device 207. For example, each of the remote access controller devices 205 and 207 may be provided by an integrated DELL® Remote Access Controller (iDRAC) available in server systems from DELL EMC® like those discussed above, although other remote access controller devices/Baseboard Management Controllers (BMCs) will fall within the scope of the present disclosure as well. The embodiments of the computing system 200 illustrated and described herein provide that computing system 200 with the dual computing device/"dual node" configuration discussed above that includes the two computing devices 204 and 206. However, as discussed above, the computing system 200 may also be configured with more than two computing systems while still benefitting from the teachings of the present disclosure. Furthermore, the computing system 200 may also be configured in a single computing device/"single node passive"/"single node active" configuration that includes only one of the computing devices 204 and 206 illustrated in FIG. 2, but one of skill in the art in possession of the present disclosure will recognize that such single computing device/"single node passive"/"single node active" configurations do not require the backplane configuration and management techniques described herein.

In the illustrated embodiment, the remote access controller device 205 may include a remote access controller processing system (not illustrated, but which may include the processor 102 discussed above with reference to FIG. 1) and a remote access controller memory system (not illustrated, but which may include the memory 114 discussed above with reference to FIG. 1) that is coupled to the remote access controller processing system and that includes instructions that, when executed by the remote access controller processing system, cause the remote access controller processing system to provide a backplane configuration/management (CONFIG/MGMT) engine 205a that is configured to perform the functionality of the backplane configuration/management engines and/or backplane configuration/management subsystems discussed below. In the specific examples provided below, the backplane configuration/management engine 205a may be provided by a backplane Application Programming Interface (API) that is configured to perform at least some of the backplane configuration/management functionality discussed below, although one of skill in the art in possession of the present disclosure will appreciate how the backplane configuration/management functionality may be enabled in other manners while remaining within the scope of the present disclosure as well.

The remote access controller device 205 may also include a remote access controller storage system (not illustrated, but which may include the storage 108 discussed above with reference to FIG. 1) that is coupled to the backplane configuration/management engine 205a (e.g., via a coupling between the remote access controller storage system and the remote access controller processing system) and that includes a backplane database 205b that is configured to store any of the information utilized by the backplane configuration/management engine 205a discussed below.

Similarly, the remote access controller device 207 may include a remote access controller processing system (not illustrated, but which may include the processor 102 discussed above with reference to FIG. 1) and a remote access controller memory system (not illustrated, but which may include the memory 114 discussed above with reference to FIG. 1) that is coupled to the remote access controller processing system and that includes instructions that, when executed by the remote access controller processing system, cause the remote access controller processing system to provide a backplane configuration/management (CONFIG/ MGMT) engine 207a that is configured to perform the functionality of the backplane configuration/management engines and/or backplane configuration/management subsystems discussed below. In the specific examples provided below, the backplane configuration/management engine 207a may be provided by a backplane API that is configured to perform at least some of the backplane configuration/ management functionality discussed below, although one of skill in the art in possession of the present disclosure will appreciate how the backplane configuration/management functionality may be enabled in other manners while remaining within the scope of the present disclosure as well.

The remote access controller device 207 may also include a remote access controller storage system (not illustrated, but which may include the storage 108 discussed above with reference to FIG. 1) that is coupled to the backplane configuration/management engine 207a (e.g., via a coupling between the remote access controller storage system and the remote access controller processing system) and that includes a backplane database 207b that is configured to store any of the information utilized by the backplane configuration/management engine 207a discussed below. However, while the backplane configuration/management subsystems for the computing devices 204 and 206 are illustrated and described as being provided by remote access controller devices 205 and 207, one of skill in the art in possession of the present disclosure will appreciate how the backplane configuration/management functionality described herein may be provided by a variety of devices while remaining within the scope of the present disclosure as well.

In the illustrated embodiment, the chassis 202 also houses a mid-plane 208 that includes a multiplexer (MUX) 208a that is coupled to the backplane configuration/management engine 205a in the remote access controller device 205 in the computing device 204, and a multiplexer (MUX) 208b that is coupled to the backplane configuration/management engine 207a in the remote access controller device 207 in the computing device 206. As will be appreciated by one of skill in the art in possession of the present disclosure, the configuration of the mid-plane 208 illustrated in FIG. 2 is specific to the dual computing device/"dual node" configuration being described herein, and respective multiplexers may be provided for each additional computing device when the computing system is configured with more than two computing devices. Furthermore, one of skill in the art in possession of the present disclosure will appreciate that the computing system 200 may be provided with the single computing device/"single node passive"/"single node active" configuration in which only a single computing device is connected to a single multiplexer in the mid-plane 208, although one of skill in the art in possession of the present disclosure will recognize that such configurations do not require the backplane configuration and management techniques described herein and thus are not discussed in detail below.

As discussed above, each of the multiplexers 208a and 208b (as well as additional multiplexers in other embodiments) may be coupled via a single/common communication bus 209 to one or more backplanes in multiple storage systems that are housed in the chassis 202. In the examples below, that communication bus 209 is provided by an Inter-Integrated Circuit (I2C) communication bus, but the teachings of the present disclosure may be utilized with other communications buses while remaining within the scope of the present disclosure as well. As such, the illustrated embodiment includes a storage system 210 that is housed in the chassis 202 and that includes a backplane 212a coupled to storage devices 212b, a backplane 214a coupled to storage devices 214b, and an expander device 216. In the dual computing device/"dual node" configuration for the computing system 200 illustrated in FIG. 2, the backplane 212a is coupled to the multiplexer 208a via the communication bus 209, and the backplane 214a is coupled to the multiplexer 208a and the multiplexer 208b via the communication bus 209, while the expander device 216 is unused due to it being provided for use in the single computing device/"single node passive"/"single node active" configurations of the computing system 200 discussed above.

Similarly, the illustrated embodiment includes a storage system 218 that is housed in the chassis 202 and that includes a backplane 218a coupled to storage devices 218b, a backplane 220a coupled to storage devices 220b, and an expander device 222. In the dual computing device/"dual node" configuration for the computing system 200 illustrated in FIG. 2, the backplane 218a is coupled to the multiplexer 208b via the communication bus 209, and the backplane 220a is coupled to the multiplexer 208b and the multiplexer 208a via the communication bus 209, while the expander device 222 is unused due to it being provided for use in the single computing device/"single node passive"/ "single node active" configurations of the computing system 200 discussed above. In a specific example where the computing system 200 is provided by server systems such as the DELL EMC® POWEREDGE® XE7100 discussed above, the expander devices 216 and 222 may each be provided by respective Serial Attached Small Computer System Interface (SCSI) (SAS) expander devices, the backplanes 212a and 218 may each be provided by respective 4×2.5" storage device backplanes (with the storage devices 212b and 218b, respectively, each providing up to four storage devices), and the backplanes 214a and 220a may each be provided by respective expander boards that are capable of connecting to up to 50 storage devices each (with the storage devices 214b and 220b, respectively, each providing up to 50 storage devices).

As such, in such examples, the computing device 204 is connected via the multiplexer 208a and the communication bus 209 to 1) a 4×2.5" storage device backplane (backplane 212a) with up to four storage devices (storage devices 212b), 2) an expander board (backplane 214a) with up to 50 storage devices (storage devices 214b), and 3) an expander board (backplane 220a) with up to 50 storage devices (storage devices 220b). Similarly, the computing device 206 is connected via the multiplexer 208b and the communication bus 209 to 1) a 4×2.5" storage device backplane (backplane 218a) with up to four storage devices (storage devices 218b), 2) an expander board (backplane 220a) with up to 50 storage devices (storage devices 220b), and 3) an expander board (backplane 214a) with up to 50 storage devices (storage devices 214b). As will be appreciated by one of skill in the art in possession of the present disclosure, the connections between the multiplexer 208a and the two expander boards (backplanes 214a and 220a) and the connections between the multiplexer 208b and the two expander boards (backplanes 214a and 220a) are provided for use with the single computing device/"single node passive"/ "single node active" configurations of the computing system 200 discussed above (thus enabling that single computing system to access the storage devices 214b and 220b) but, as discussed herein, cause issues with the dual computing device/"dual node" configuration for the computing system 200 illustrated in FIG. 2 or other multi-computing-system/ "multi-node" configurations of the computing system 200.

However, while a specific computing system 200 and specific configurations of that computing system have been illustrated and described, one of skill in the art in possession of the present disclosure will recognize that computing systems (or other devices operating according to the teachings of the present disclosure in a manner similar to that described below for the computing system 200) may include a variety of components and/or component configurations for providing conventional computing system functionality, as well as the functionality discussed below, while remaining within the scope of the present disclosure as well.

Figure 3:
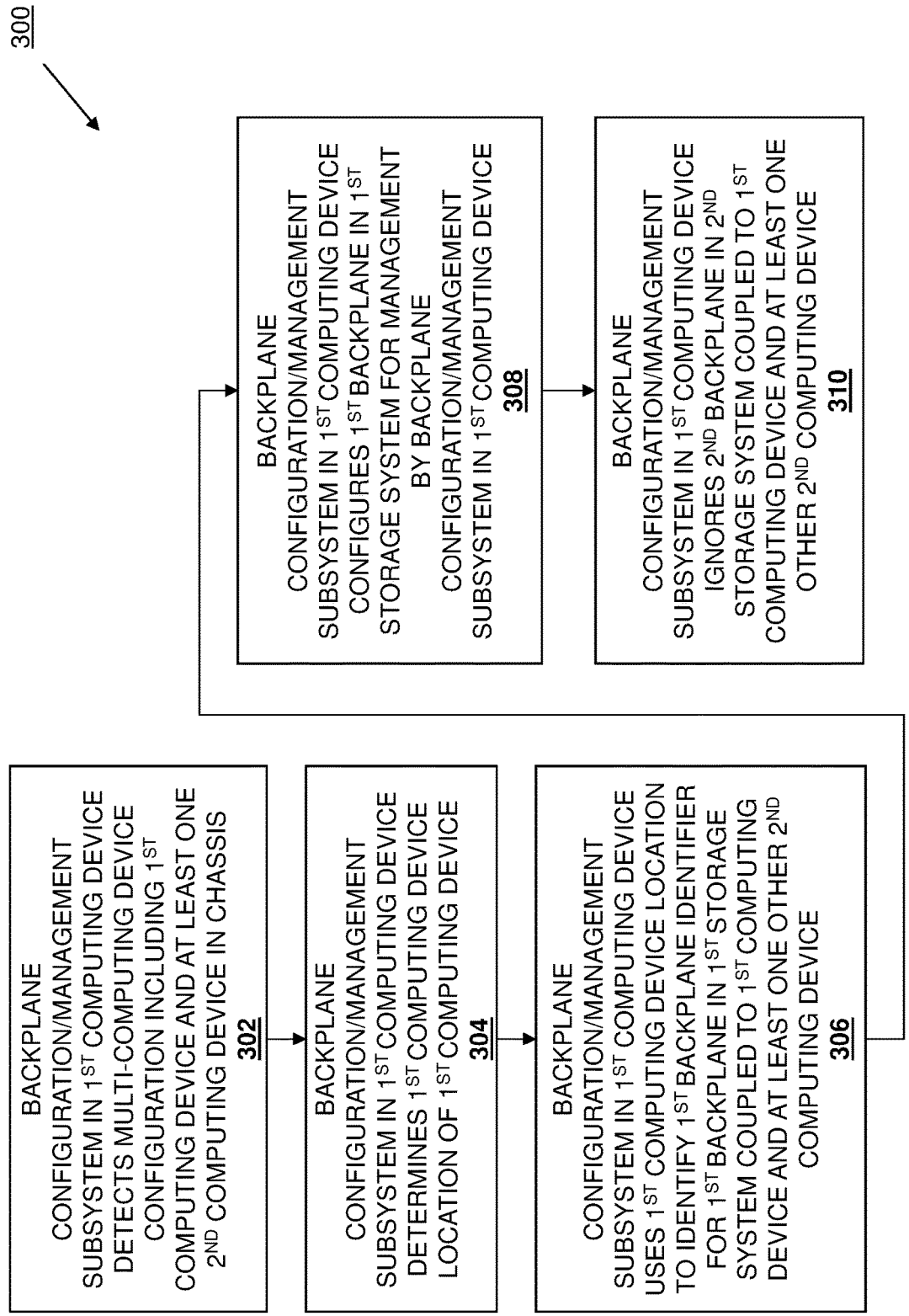
FIG. 3 is a flow chart illustrating an embodiment of a method for configuring and managing backplanes.

Referring now to FIG. 3, an embodiment of a method 300 for configuring and managing backplanes is illustrated. As discussed below, the systems and methods of the present disclosure provide for the configuration and management of backplanes in different storage systems that are connected via a single/common communication bus to each computing device in a multi-computing device configuration. For example, the backplane management and configuration system of the present disclosure may include a chassis housing a first storage system having a first backplane, a second storage system having a second backplane, a second computing device coupled to each of the first backplane and the second backplane via a second multiplexer and a communication bus, and a first computing device coupled to each of the first backplane and the second backplane via a first multiplexer and the communication bus. A backplane configuration/management subsystem in the first computing device detects a multi-computing-device configuration including the first and second computing devices in the chassis and, in response, determines a first computing device location in the chassis. Based on the first computing device location, the backplane configuration/management subsystem identifies a first backplane identifier for the first backplane and, in response, configures the first backplane for management by the backplane configuration/management subsystem and ignores the second backplane. As such, each of multiple computing devices in a chassis will configure and manage only one of multiple backplanes that are connected to each of those computing devices via a single/common communication bus, thus preventing the interchanging of those backplanes between the computing devices that occurs in conventional backplane management and configuration systems.

The method 300 begins at block 302 where a backplane configuration/management subsystem in a first computing device detects a multi-computing device configuration including the first computing device and a second computing device in a chassis. In an embodiment, at block 302, the computing system 200 may be reset, rebooted, and/or otherwise initialized such that initialization operations are performed that include a backplane initialization routine/function. In an example and as part of the backplane initialization routine/function included in the initialization operations, the backplane configuration/management engines 205a and 207a in the remote access controller devices 205 and 207, respectively, may operate to detect a configuration of computing device(s) in the chassis 202 of the computing system 200. Continuing with the specific example discussed above, each of the backplane configuration/management engines 205a and 207a may include a backplane API that may be called as part of the backplane initialization routine/function included in the initialization operations, and that may operate to detect whether the computing system 200 includes the single computing device/"single node passive"/"single node active" configuration, the dual computing device/"dual node" configuration, or other multi-computing-device configurations discussed above.

For example, the backplane configuration/management engines 205a and 207a in the remote access controller devices 205 and 207 may operate to detect the computing device configuration the computing system 200 that is defined by the number of computing devices that are included in the computing system 200 via, for example, accessing a register subsystem in a Complex Programmable Logic Device (CPLD) in that computing device. For example, the CPLD in each computing device 204 and 206 may include a register subsystem having the following structure:

| MB CPLD SPIX Map | |
|---|---|
| Register | Name |
| 0xCA.0 | Server Sled Position ID0 |
| 0xCA.1 | Server Sled Position ID1 |
| 0xCA.2 | Server System Configuration: Single Server: 0 Dual Server: 1 |

Using this specific example of the register subsystem in CPLDs in the computing devices 204 and 206, the 0xCA.2 register (e.g., bit 2 in the register subsystem) of the CPLDs may be set to indicate a dual-server/multi-computing-device configuration (and one of skill in the art in possession of the present disclosure will recognize that if the 0xCA.2 register of the CPLDs is not set that will indicate a single-server/ single-computing-device configuration). As such, in the embodiments illustrated and discussed herein and at block 302, the backplane configuration/management engines 205a and 207a in the remote access controller devices 205 and 207 may each detect that the computing system 200 is currently provided with the dual computing device/"dual node" configuration that includes the computing device 204 and the computing device 206. However, while described as being stored in a specific structure in a CPLD for a server system that is limited to a single server or a dual server configuration, one of skill in the art in possession of the present disclosure will appreciate how the information utilized to provide the backplane configuration and management functionality discussed below may be stored in a variety of devices and/or in a variety of manners (including in a register subsystem configured for a server system with more than two server devices) that will fall within the scope of the present disclosure as well.

The method 300 then proceeds to block 304 where the backplane configuration/management subsystem in the first computing device determines a first computing device location of the first computing device. In an embodiment, at block 304, the backplane configuration/management engine 205a in the remote access controller device 205 may determine a computing device location of the computing device 204. Continuing with the specific example discussed above, the backplane configuration/management engine 205a may include the backplane API that was called as part of the backplane initialization routine/function included in the initialization operations, and that may operate to determine the computing device location of the computing device 204 relative to the computing device location of the computing device 206 (e.g., the computing device 204 may be provided in "server sled 1" while the computing device 206 may be provided in "server sled 2".)

Using the specific example of the register subsystem in the CPLDs discussed above, the 0xCA.0 register (e.g., bit 0 in the register subsystem) of the CPLD may be set to indicate a server device is in the "server sled 1" position in the chassis 202, and the 0xCA.1 register (e.g., bit 1 in the register subsystem) of the CPLD may be set to indicate a server device is in the "server sled 2" position in the chassis 202. However, while a dual computing device/"dual node" configuration is described in the examples herein, one of skill in the art in possession of the present disclosure will appreciate how the backplane API that provides the backplane configuration/management engine 205*a* may operate to determine the computing device location of the computing device 204 relative to all of the other computing devices in any multi-computing device configuration detected at block 302.

In another embodiment of block 304, the backplane configuration/management engine 207*a* in the remote access controller device 207 may determine a computing device location of the computing device 206. Continuing with the specific example discussed above, the backplane configuration/management engine 207*a* may include the backplane API that was called as part of the backplane initialization routine/function included in the initialization operations, and that may operate to determine the computing device location of the computing device 206 relative to the computing device location of the computing device 204 (e.g., the computing device 206 may be provided in "server sled 2" while the computing device 204 may be provided in "server sled 1".)

Continuing with the specific example of the register subsystem in the CPLDs discussed above, the 0xCA.0 register (e.g., bit 0 in the register subsystem) of the CPLD may be set to indicate a server device is in the "server sled 1" position in the chassis 202, and the 0xCA.1 register (e.g., bit 1 in the register subsystem) of the CPLD may be set to indicate a server device is in the "server sled 2" position in the chassis 202. However, while a dual computing device/ "dual node" configuration is described in the examples herein, one of skill in the art in possession of the present disclosure will appreciate how the backplane API that provides the backplane configuration/management engine 207*a* may operate to determine the computing device location of the computing device 206 relative to all of the other computing devices in any multi-computing device configuration detected at block 302).

The method 300 then proceeds to block 306 where the backplane configuration/management subsystem in the first computing device uses the first computing device location to identify a first backplane identifier for a first backplane in a first storage system that is coupled to the first computing device and at least one second computing device. In an embodiment, at block 306, the backplane configuration/management engine 205*a* in the remote access controller device 205 may use the computing device location of the computing device 204 determined at block 304 to identify a backplane identifier of the backplane 214*a* in the storage system 210 that is coupled to the computing device 204 and the computing device 206. Continuing with the specific example discussed above, the backplane configuration/management engine 205*a* may include the backplane API that was called as part of the backplane initialization routine/function included in the initialization operations, and that may operate to use the computing device location of the computing device 204 determined at block 304 to identify a backplane identifier of the backplane 214*a* in the storage system 210 that is coupled to the computing device 204 and the computing device 206 via the I2C communication bus 209 and the multiplexers 208*a* and 208*b*, respectively, by identifying that backplane identifier (e.g., "bay 1") from an I2C topology configuration using the that computing device location (e.g., "server sled 1").

For example, backplane identifiers (e.g., "bay identifiers") may be fixed and defined in an I2C topology configuration such as the example illustrated in FIG. 5. As can be seen, in a single computing device/"single node passive"/"single node active" configuration of the computing system 200 that includes only the computing device 204, the computing device 204 will designate the backplane 212*a* in "bay 0", the backplane 214*a* in "bay 1", and the backplane 220*a* in "bay 2". However, in the dual computing device/"dual node" configuration of the computing system 200 that includes the computing device 204 and the computing device 206, the computing device will designate the backplane 212*a* in "bay 0" and the backplane 214*a* in "bay 1", while the computing device 206 will designate the backplane 218*a* in "bay 0" and the backplane 220*a* in "bay 2", thus eliminating the interchanging of the designations of the backplane 214*a* by the computing devices 204 and 206, and the designations of the backplane 220*a* by the computing devices 204 and 206, that occurs in conventional systems. As such, the backplane configuration/management engine 205*a* in the remote access controller device 205 may use the computing device location of the computing device 204 to read the I2C topology configuration above to identify the backplane identifier for the backplane 214*a* in the storage system 210 that is coupled to the computing device 204 and the computing device 206.

In another embodiment, at block 306, the backplane configuration/management engine 207*a* in the remote access controller device 207 may use the computing device location of the computing device 206 determined at block 304 to identify a backplane identifier of the backplane 220*a* in the storage system 218 that is coupled to the computing device 206 and the computing device 204. Continuing with the specific example discussed above, the backplane configuration/management engine 207*a* may include the backplane API that was called as part of the backplane initialization routine/function included in the initialization operations, and that may operate to use the computing device location of the computing device 206 determined at block 304 to identify a backplane identifier of the backplane 220*a* in the storage system 218 that is coupled to the computing device 206 and the computing device 204 via the I2C communication bus 209 and the multiplexers 208*b* and 208*a*, respectively, by identifying that backplane identifier (e.g., "bay 2") from an I2C topology configuration using that computing device location (e.g., "server sled 2"). As such, the backplane configuration/management engine 207*a* in the remote access controller device 207 may use the computing device location of the computing device 206 to read the I2C topology configuration above to identify the backplane identifier for the backplane 220*a* in the storage system 218 that is coupled to the computing device 206 and the computing device 204.

The method 300 then proceeds to block 308 where the backplane configuration/management subsystem in the first computing device configures the first backplane in the first storage system for management by the backplane configuration/management subsystem in the first computing device, and to block 310 where the backplane configuration/management subsystem in the first computing device ignores a second backplane in a second storage system that is coupled to the first computing device and the at least one second computing device. In an embodiment, at block 308 and 310, the backplane configuration/management engine 205*a* in the remote access controller device 205 may configure the backplane 214*a* in the storage system 210 for management by the backplane configuration/management engine 205*a*. Continuing with the specific example discussed above, the backplane configuration/management engine 205*a* may include the backplane API that was called as part of the backplane initialization routine/function included in the initialization operations, and that may operate to provide the backplane identifier (e.g., "bay 1") that was identified at block 306 for the backplane 214*a* to a Storage Enclosure Processor (SEP) read/routine function (e.g., via an I2C interface) that is configured to cause an SEP to read from a particular SEP memory map that points the backplane 214*a*.

For example, the SEP discussed above may be included in the storage system 210 and may include a SEP memory map (e.g., included in memory device(s) provided on the backplane 214*a*) that stores information such as, for example, a bay identifier, a number of storage devices, and/or other information known in the art (e.g., at a memory address such as "0XC2"). As such, during system initialization, the remote access controller device 205 may read the bay identifier from the I2C topology configuration discussed above, and may pass this information to a backplane API that communicates internally with the SEP and reads its SEP memory map i.e., (the backplane information on the backplane 214*a*) and compares the bay identifier read from the SEP memory map with the bay identifier that is fixed and defined in the I2C topology configuration. In the event bay identifiers match, then the location of the backplane 214*a* corresponds the same computing device location as the computing device 204, and the initialization of that backplane 214*a* is allowed to proceed.

Figure 4A:
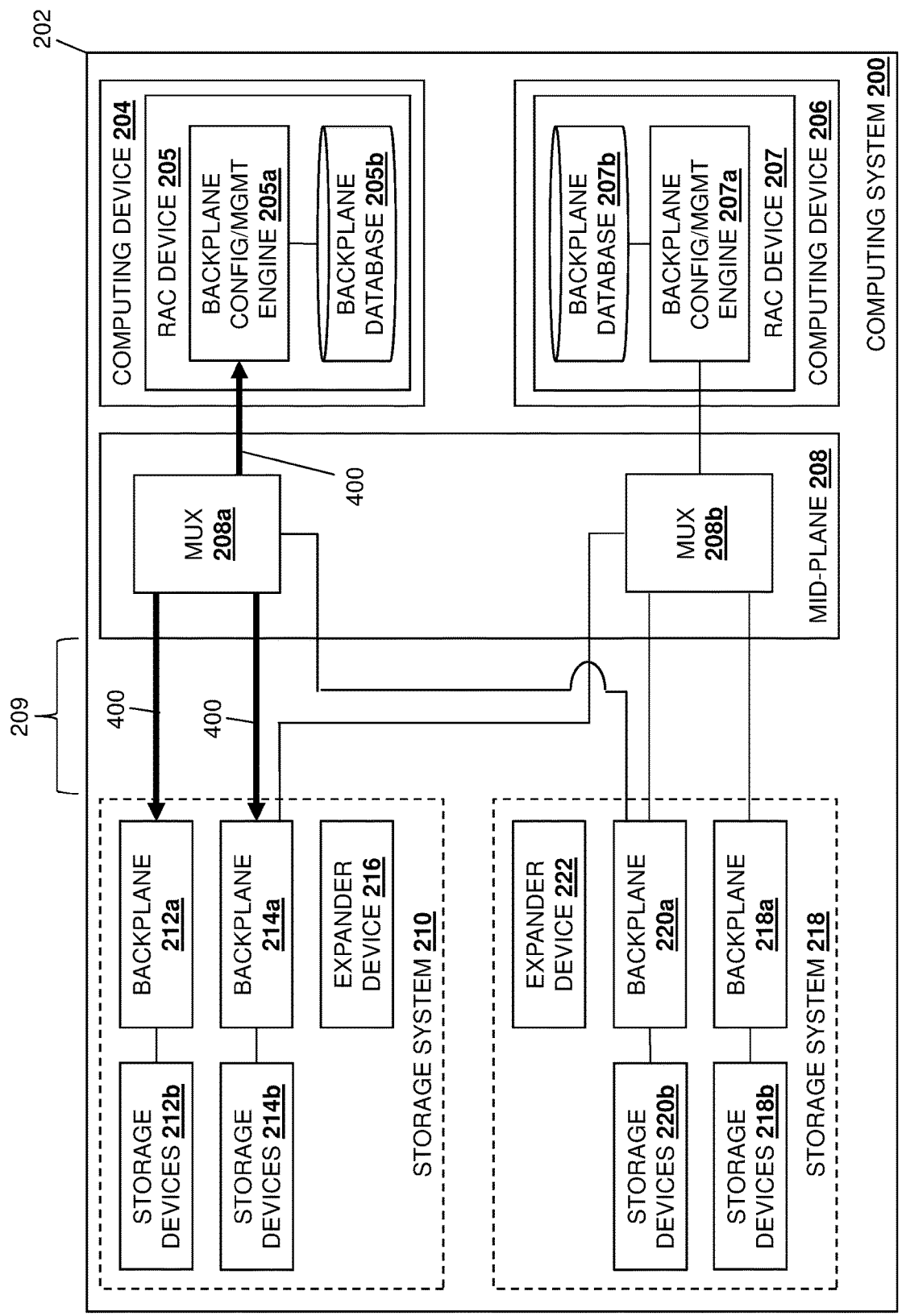
FIG. 4A is a schematic view illustrating an embodiment of the computing system of FIG. 2 operating during the method of FIG. 3.

As such, with reference to FIG. 4A, following the configuration of the backplane 214*a* in the storage system 210 for management by the backplane configuration/management engine 205*a* (as well as the configuration of the backplane 214*a* in the storage system 210 for management by the backplane configuration/management engine 205*a*), the backplane configuration/management engine 205*a* in the remote access controller device 205 may perform management operations 400 that on either of the backplanes 212*a* and 214*a*, while ignoring the backplane 220*a*. As will be appreciated by one of skill in the art in possession of the present disclosure, the backplane configuration/management engine 205*a* in the remote access controller device 205 may ignore the backplane 220*a* at block 310 due to the SEP not being configured to read from a particular SEP memory map that points the backplane 220*a*.

In another embodiment, at block 308 and 310, the backplane configuration/management engine 207*a* in the remote access controller device 207 may configure the backplane 220*a* in the storage system 218 for management by the backplane configuration/management engine 207*a*. Continuing with the specific example discussed above, the backplane configuration/management engine 207*a* may include the backplane API that was called as part of the backplane initialization routine/function included in the initialization operations, and that may operate to provide the backplane identifier (e.g., "bay 2") that was identified at block 306 for the backplane 220*a* to a Storage Enclosure Processor (SEP) read/routine function (e.g., via an I2C interface) that is configured to cause an SEP to read from a particular SEP memory map that points the backplane 220*a*.

For example, the SEP discussed above may be included in the storage system 218 and may include a SEP memory map (e.g., included in memory device(s) provided on the backplane 220*a*) that stores information such as, for example, a bay identifier, a number of storage devices, and/or other information known in the art (e.g., at a memory address such as "0XC2"). As such, during system initialization, the remote access controller device 207 may read the bay identifier from the I2C topology configuration discussed above, and may pass this information to a backplane API that communicates internally with the SEP and reads its SEP memory map i.e., (the backplane information on the backplane 220*a*) and compares the bay identifier read from the SEP memory map with the bay identifier that is fixed and defined in the I2C topology configuration. In the event bay identifiers match, then the location of the backplane 220*a* corresponds to the computing device location as the computing device 206, and the initialization of that backplane 220*a* is allowed to proceed.

Figure 4B:
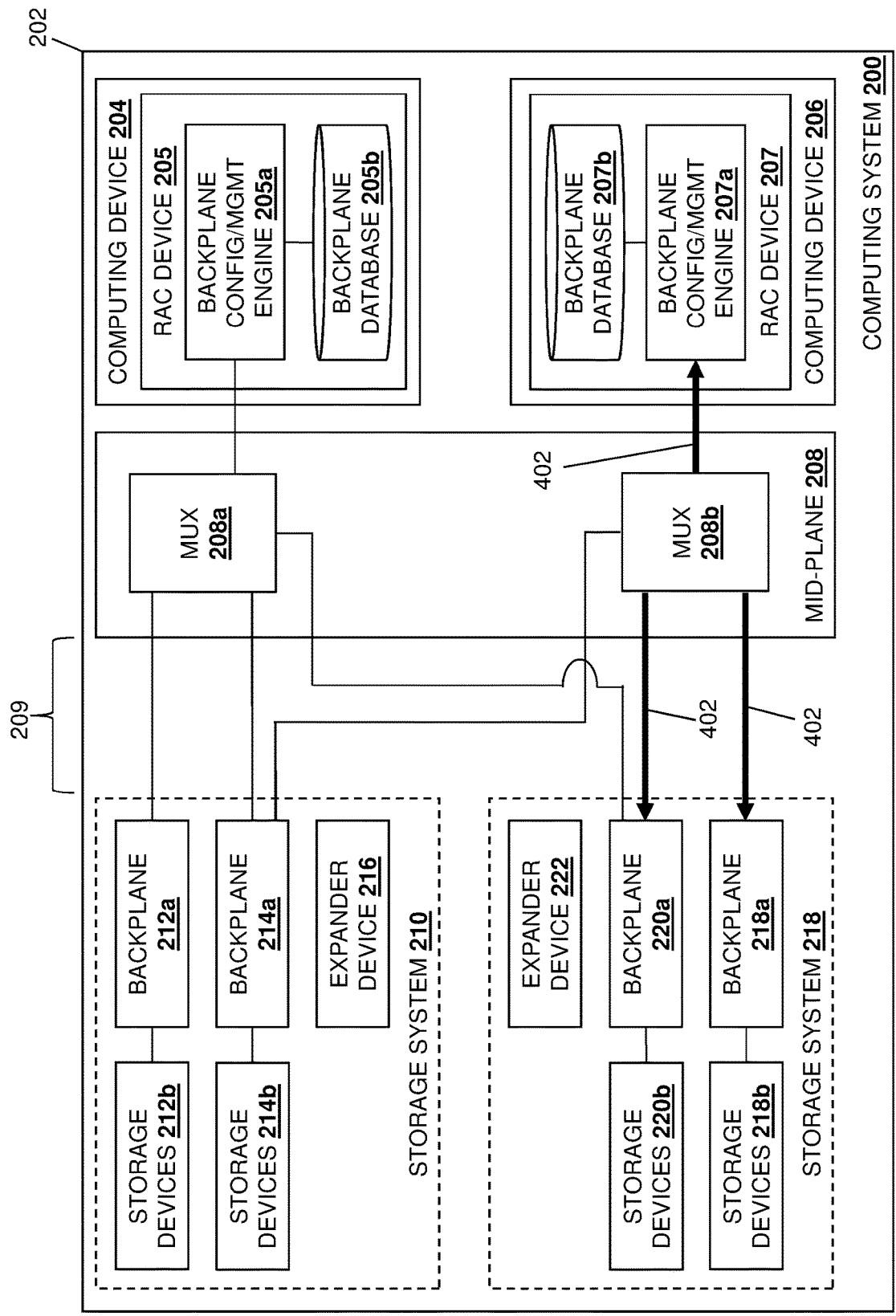
FIG. 4B is a schematic view illustrating an embodiment of the computing system of FIG. 2 operating during the method of FIG. 3.

As such, with reference to FIG. 4B, following the configuration of the backplane 220*a* in the storage system 218 for management by the backplane configuration/management engine 207*a* (as well as the configuration of the backplane 218*a* in the storage system 218 for management by the backplane configuration/management engine 207*a*), the backplane configuration/management engine 207*a* in the remote access controller device 207 may perform management operations 402 that on either of the backplanes 218*a* and 220*a*, while ignoring the backplane 214*a*. As will be appreciated by one of skill in the art in possession of the present disclosure, the backplane configuration/management engine 207*a* in the remote access controller device 207 may ignore the backplane 220*a* at block 310 due to the SEP not being configured to read from a particular SEP memory map that points the backplane 220*a*.

Thus, systems and methods have been described that provide for the configuration and management of backplanes in different storage systems that are connected via a single/common I2C communication bus to each server device in a multi-server device configuration. For example, the backplane management and configuration system of the present disclosure may include a chassis housing a first storage system having a first backplane, a second storage system having a second backplane, a second server device coupled to each of the first backplane and the second backplane via a second multiplexer and an I2C communication bus, and a first server device coupled to each of the first backplane and the second backplane via a first multiplexer and the I2C communication bus. A backplane configuration/management subsystem in the first server device detects a multi-server-device configuration including the first and second server devices in the chassis and, in response, determines a first server device location in the chassis. Based on the first server device location, the backplane configuration/management subsystem identifies a first backplane identifier for the first backplane and, in response, configures the first backplane for management by the backplane configuration/management subsystem and ignores the second backplane. As such, each of multiple server devices in a chassis will configure and manage only one of multiple backplanes that are connected to each of those server devices via a single/common I2C communication bus, thus preventing the interchanging of those backplanes between the server devices that occurs in conventional backplane management and configuration systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A backplane management and configuration system, comprising:
a chassis;
a first storage system that is located in the chassis and that includes a first backplane;
a second storage system that is located in the chassis and that includes a second backplane;
a second computing device that is located in the chassis and that is coupled to each of the first backplane in the first storage system and the second backplane in the second storage system via a second multiplexer and a communication bus;
a first computing device that is located in the chassis and that is coupled to each of the first backplane in the first storage system and the second backplane in the second storage system via a first multiplexer and the communication bus, wherein a first backplane configuration/management subsystem in the first computing device is configured to:
detect a multi-computing-device configuration that includes the first computing device and the second computing device in the chassis;
determine, in response to detecting the multi-computing-device configuration, a first computing device location of the first computing device in the chassis;
identify, based on the first computing device location, a first backplane identifier for the first backplane in the first storage system and, in response:
configure the first backplane in first storage system for management by the first backplane configuration/management subsystem in the first computing device; and
ignore the second backplane in the second storage system.

2. The system of claim 1, wherein the communication bus is an Inter-Integrated Circuit (I2C) communication bus.

3. The system of claim 2, wherein the identifying the first backplane identifier for the first backplane in the first storage system based on the first computing device location includes using an I2C topology configuration to identify the first backplane identifier in the first storage system based on the first computing device location.

4. The system of claim 1, wherein the configuring the first backplane in first storage system for management by the first backplane configuration/management subsystem in the first computing device includes providing the first backplane identifier to a Storage Enclosure Processor (SEP) read/routine function to cause an SEP to read from a particular SEP memory map.

5. The system of claim 1, wherein the first backplane configuration/management subsystem is provided by a remote access controller device in the first computing device.

6. The system of claim 1, wherein the first backplane configuration/management subsystem includes a backplane Application Programming Interface (API) that is called during a backplane initialization routine/function and that provides for the performance of the operations by the backplane configuration/management subsystem.

7. The system of claim 1, wherein a second backplane configuration/management subsystem in the second computing device is configured to:
detect the multi-computing-device configuration that includes the first computing device and the second computing device in the chassis;
determine, in response to detecting the multi-computing-device configuration, a second computing device location of the second computing device in the chassis;
identify, based on the second computing device location, a second backplane identifier for the second backplane in the second storage system and, in response:
configure the second backplane in second storage system for management by second backplane configuration/management subsystem in the second computing device; and
ignore the first backplane in the first storage system.

8. A first computing device, comprising:
a processing system; and
a memory system that is coupled to the processing system and that includes instructions that, when executed by the processing system, cause the processing system to provide a backplane configuration/management engine that is configured to:
detect a multi-computing-device configuration that includes the first computing device and a second computing device in a chassis;
determine, in response to detecting the multi-computing-device configuration, a first computing device location of the first computing device in the chassis;
identify, based on the first computing device location, a first backplane identifier for a first backplane in a first storage system that is coupled to each of the first computing device and the second computing device via a communication bus and, in response:
configure the first backplane in first storage system for management by the first backplane configuration/management engine; and
ignore a second backplane in a second storage system that is coupled to each of the first computing device and the second computing device via the communication bus.

9. The IHS of claim 8, wherein the communication bus is an Inter-Integrated Circuit (I2C) communication bus.

10. The IHS of claim 9, wherein the identifying the first backplane identifier for the first backplane in the first storage system based on the first computing device location includes using an I2C topology configuration to identify the first backplane identifier in the first storage system based on the first computing device location.

11. The IHS of claim 8, wherein the configuring the first backplane in first storage system for management by the backplane configuration/management engine includes providing the first backplane identifier to a Storage Enclosure Processor (SEP) read/routine function to cause an SEP to read from a particular SEP memory map.

12. The IHS of claim 8, wherein the backplane configuration/management engine is provided by a remote access controller device in the first computing device.

13. The IHS of claim 8, wherein the backplane configuration/management engine includes a backplane Application Programming Interface (API) that is called during a backplane initialization routine/function and that provides for the performance of the operations by the backplane configuration/management engine.

14. A method for configuring and managing backplanes, comprising:
detecting, by a first backplane configuration/management subsystem in a first computing device, a multi-computing-device configuration that includes the first computing device and a second computing device in a chassis;

determining, by the first backplane configuration/management subsystem in the first computing device in response to detecting the multi-computing-device configuration, a first computing device location of the first computing device in the chassis;

identifying, by the first backplane configuration/management subsystem in the first computing device based on the first computing device location, a first backplane identifier for a first backplane in a first storage system that is coupled to each of the first computing device and the second computing device via a communication bus and, in response:

configuring the first backplane in first storage system for management by the first backplane configuration/management subsystem in the first computing device; and ignoring a second backplane in a second storage system that is coupled to each of the first computing device and the second computing device via the communication bus.

15. The method of claim 14, wherein the communication bus is an Inter-Integrated Circuit (I2C) communication bus.

16. The method of claim 15, wherein the identifying the first backplane identifier for the first backplane in the first storage system based on the first computing device location includes using an I2C topology configuration to identify the first backplane identifier in the first storage system based on the first computing device location.

17. The method of claim 14, wherein the configuring the first backplane in first storage system for management by the first backplane configuration/management subsystem in the first computing device includes providing the first backplane identifier to a Storage Enclosure Processor (SEP) read/routine function to cause an SEP to read from a particular SEP memory map.

18. The method of claim 14, wherein the first backplane configuration/management subsystem is provided by a remote access controller device in the first computing device.

19. The method of claim 14, wherein the first backplane configuration/management subsystem in the first computing device includes a backplane Application Programming Interface (API) that is called during a backplane initialization routine/function and that provides for the performance of the operations by the backplane configuration/management engine.

20. The method of claim 14, further comprising:

detecting, by a second backplane configuration/management subsystem in the second computing device, the multi-computing-device configuration that includes the first computing device and the second computing device in the chassis;

determining, by the second backplane configuration/management subsystem in the second computing device in response to detecting the multi-computing-device configuration, a second computing device location of the second computing device in the chassis;

identifying, by the second backplane configuration/management subsystem in the second computing device based on the second computing device location, a second backplane identifier for the second backplane in the second storage system and, in response:

configuring the second backplane in second storage system for management by the second backplane configuration/management subsystem in the second computing device; and ignoring the first backplane in the first storage system.

* * * * *